United States Patent
Becker et al.

(10) Patent No.: US 10,847,692 B2
(45) Date of Patent: Nov. 24, 2020

(54) FOIL STRUCTURE WITH GENERATION OF VISIBLE LIGHT BY MEANS OF LED TECHNOLOGY

(71) Applicant: Schreiner Group GmbH & Co. KG, Oberschleissheim (DE)

(72) Inventors: Johannes Becker, Ilmmuenster (DE); Sebastian Gepp, Dresden (DE); Manfred Hartmann, Petershausen (DE); Hartmut Wiederrecht, Eching (DE)

(73) Assignee: Schreiner Group GmbH & Co. KG, Oberschleissheim (DE)

( * ) Notice: Subject to any disclaimer, the term of this patent is extended or adjusted under 35 U.S.C. 154(b) by 56 days.

(21) Appl. No.: 16/010,667

(22) Filed: Jun. 18, 2018

(65) Prior Publication Data

US 2018/0366627 A1 Dec. 20, 2018

(30) Foreign Application Priority Data

Jun. 19, 2017 (DE) .................. 10 2017 113 380

(51) Int. Cl.
*H01L 33/62* (2010.01)
*H01L 33/50* (2010.01)
(Continued)

(52) U.S. Cl.
CPC ............... *H01L 33/62* (2013.01); *F21K 9/64* (2016.08); *G06K 19/0723* (2013.01);
(Continued)

(58) Field of Classification Search
CPC ..... H01L 33/62; H01L 25/167; H01L 33/505; H01L 33/507; H01L 2933/0066;
(Continued)

(56) References Cited

U.S. PATENT DOCUMENTS 6,160,273 A * 12/2000 Fork .................. H01L 51/5262
257/103
7,988,336 B1 8/2011 Harbers et al.
(Continued)

FOREIGN PATENT DOCUMENTS

CN 105980768 A 9/2016
CN 108139034 A 6/2018
(Continued)

OTHER PUBLICATIONS

Chinese Office Action in Chinese Application No. 201810613335.9, dated Jun. 19, 2020 with English translation.

*Primary Examiner* — Stephen W Smoot
*Assistant Examiner* — Vicki B. Booker
(74) *Attorney, Agent, or Firm* — Collard & Roe, P.C.

(57) ABSTRACT

A foil structure with generation of visible light via LED technology has a carrier foil and an LED chip for generation of UV light. The LED chip is disposed on a first portion of the carrier foil and is provided with a light output face for emission of the UV light. The foil structure further has a color reaction layer for conversion of the UV light into the visible light, wherein the color reaction layer is disposed on a second portion of the carrier foil. The carrier foil is folded over in such a way that the second portion of the carrier foil is disposed above the first portion of the carrier foil and the color reaction layer is disposed above the LED chip or in a manner laterally offset relative to the LED chip.

20 Claims, 12 Drawing Sheets

(51) Int. Cl.
*H01L 25/16* (2006.01)
*G06K 19/07* (2006.01)
*H03K 17/96* (2006.01)
*F21K 9/64* (2016.01)
*H05K 1/18* (2006.01)
*H05K 1/02* (2006.01)

(52) U.S. Cl.
CPC .......... *H01L 25/167* (2013.01); *H01L 33/505* (2013.01); *H03K 17/962* (2013.01); *H05K 1/189* (2013.01); *H01L 33/507* (2013.01); *H01L 2933/0041* (2013.01); *H01L 2933/0066* (2013.01); *H03K 2217/960785* (2013.01); *H05K 1/0274* (2013.01); *H05K 2201/0108* (2013.01); *H05K 2201/055* (2013.01); *H05K 2201/10106* (2013.01)

(58) Field of Classification Search
CPC .... H01L 2933/0041; H01L 2933/0091; H05K 1/189; H05K 2201/0108; H05K 2201/055; H05K 2201/10106; H05K 1/0274; F21K 9/64; F21K 9/61; H03K 17/962; H03K 2217/960785; G06K 19/0723; F21Y 2115/10; F21Y 2107/70; F21V 2200/10; F21V 9/32; F21V 9/30; F21V 9/38; F21S 4/24; G02B 6/0088; G02B 6/005

See application file for complete search history.

(56) References Cited

U.S. PATENT DOCUMENTS

| | | | |
|---|---|---|---|
| 8,084,934 B2 | 12/2011 | Kim et al. | |
| 8,362,512 B2 | 1/2013 | Hussell et al. | |
| 8,795,817 B2 | 8/2014 | Kwak et al. | |
| 9,272,370 B2* | 3/2016 | Finn | H01Q 1/2225 |
| 9,543,479 B2 | 1/2017 | Herrmann | |
| 9,618,179 B2 | 4/2017 | Michiels et al. | |
| 9,722,146 B2 | 8/2017 | Kwak et al. | |
| 9,902,315 B2 | 2/2018 | Salter et al. | |
| 9,991,431 B2 | 6/2018 | Lacey et al. | |
| 2002/0088987 A1 | 7/2002 | Sakurai | |
| 2005/0085010 A1 | 4/2005 | Tsunoda et al. | |
| 2005/0230853 A1 | 10/2005 | Yoshikawa | |
| 2006/0029819 A1 | 2/2006 | Cho | |
| 2006/0034084 A1 | 2/2006 | Matsuura et al. | |
| 2007/0024173 A1 | 2/2007 | Braune | |
| 2008/0043194 A1 | 2/2008 | Lin et al. | |
| 2008/0074901 A1 | 3/2008 | David et al. | |
| 2008/0142816 A1 | 6/2008 | Bierhuizen et al. | |
| 2009/0101930 A1 | 4/2009 | Li | |
| 2010/0084665 A1 | 4/2010 | Daniels et al. | |
| 2011/0148279 A1 | 6/2011 | Li et al. | |
| 2011/0294240 A1 | 12/2011 | Kim | |
| 2012/0140436 A1 | 6/2012 | Yang et al. | |
| 2012/0162945 A1 | 6/2012 | Schreiner | |
| 2012/0199005 A1 | 8/2012 | Koji et al. | |
| 2012/0261680 A1 | 10/2012 | Demuynck | |
| 2013/0033888 A1* | 2/2013 | Van Der Wel | F21V 3/06 362/555 |
| 2013/0234187 A1 | 9/2013 | Ebe et al. | |
| 2013/0250546 A1 | 9/2013 | Hu et al. | |
| 2013/0334559 A1 | 12/2013 | Vdovin et al. | |
| 2014/0072812 A1 | 3/2014 | Hamada et al. | |
| 2014/0231834 A1 | 8/2014 | Lowenthal et al. | |
| 2014/0233212 A1* | 8/2014 | Park | G02F 1/133606 362/84 |
| 2014/0376223 A1 | 12/2014 | Bergenek | |
| 2015/0043243 A1 | 2/2015 | Gourlay | |
| 2015/0102722 A1 | 4/2015 | Ohbayashi et al. | |
| 2015/0132873 A1 | 5/2015 | Rogers et al. | |
| 2016/0268488 A1 | 9/2016 | Goeoetz et al. | |
| 2016/0298822 A1 | 10/2016 | Michiels et al. | |
| 2016/0315236 A1 | 10/2016 | Makkonen et al. | |
| 2016/0341396 A1 | 11/2016 | Lee | |
| 2017/0160457 A1 | 6/2017 | Roh et al. | |
| 2017/0311422 A1 | 10/2017 | Arai | |
| 2018/0197912 A1 | 7/2018 | Sweegers et al. | |

FOREIGN PATENT DOCUMENTS

| | | |
|---|---|---|
| DE | 103 06 870 A1 | 9/2004 |
| DE | 10 2007 039 416 A1 | 2/2009 |
| DE | 102009020540 A1 | 12/2010 |
| DE | 10 2009 020 540 B4 | 6/2012 |
| DE | 10 2012 102 804 B3 | 2/2013 |
| DE | 11 2011 102 800 T5 | 6/2013 |
| DE | 10 2012 101 463 A1 | 8/2013 |
| DE | 10 2012 202 927 A1 | 8/2013 |
| DE | 10 2014 104 230 A1 | 10/2015 |
| DE | 10 2014 110 067 A1 | 1/2016 |
| DE | 20 2017 102 154 U1 | 5/2017 |
| EP | 2 469 991 A2 | 6/2012 |
| EP | 1 611 619 B1 | 1/2013 |
| EP | 2 779 806 A2 | 9/2014 |
| JP | 2003-092020 A | 3/2003 |
| KR | 20130022595 A | 3/2013 |
| WO | 2005/100016 A2 | 10/2005 |
| WO | 2013/105007 A1 | 7/2013 |
| WO | 2015/058983 A1 | 4/2015 |

* cited by examiner

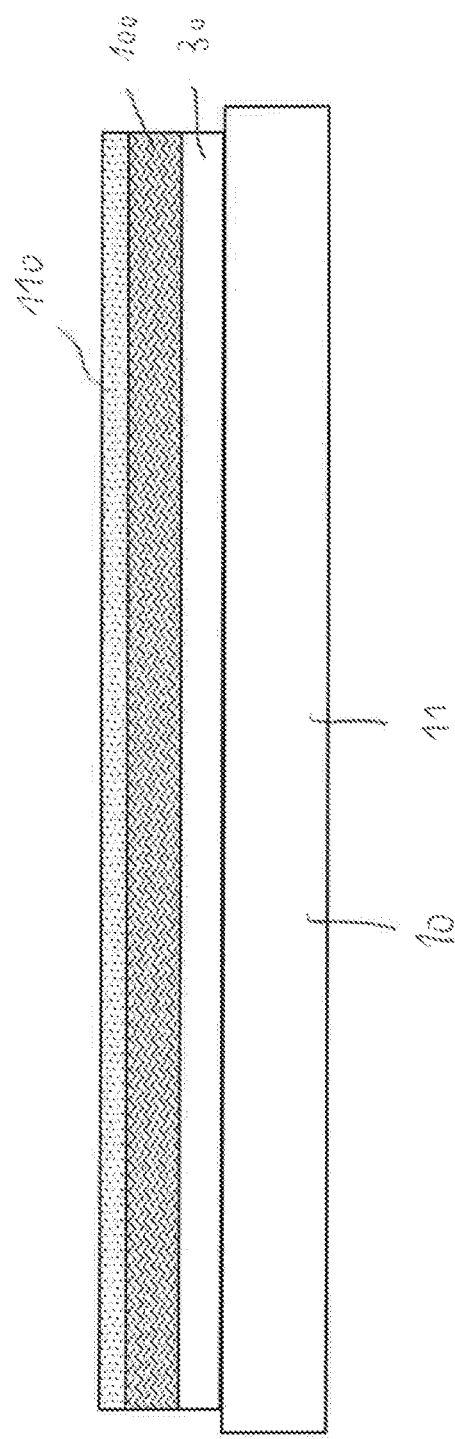

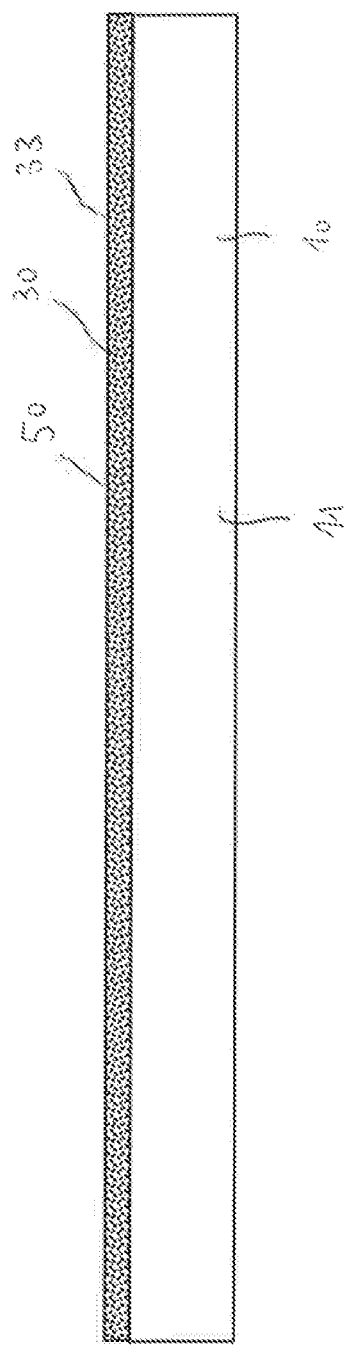

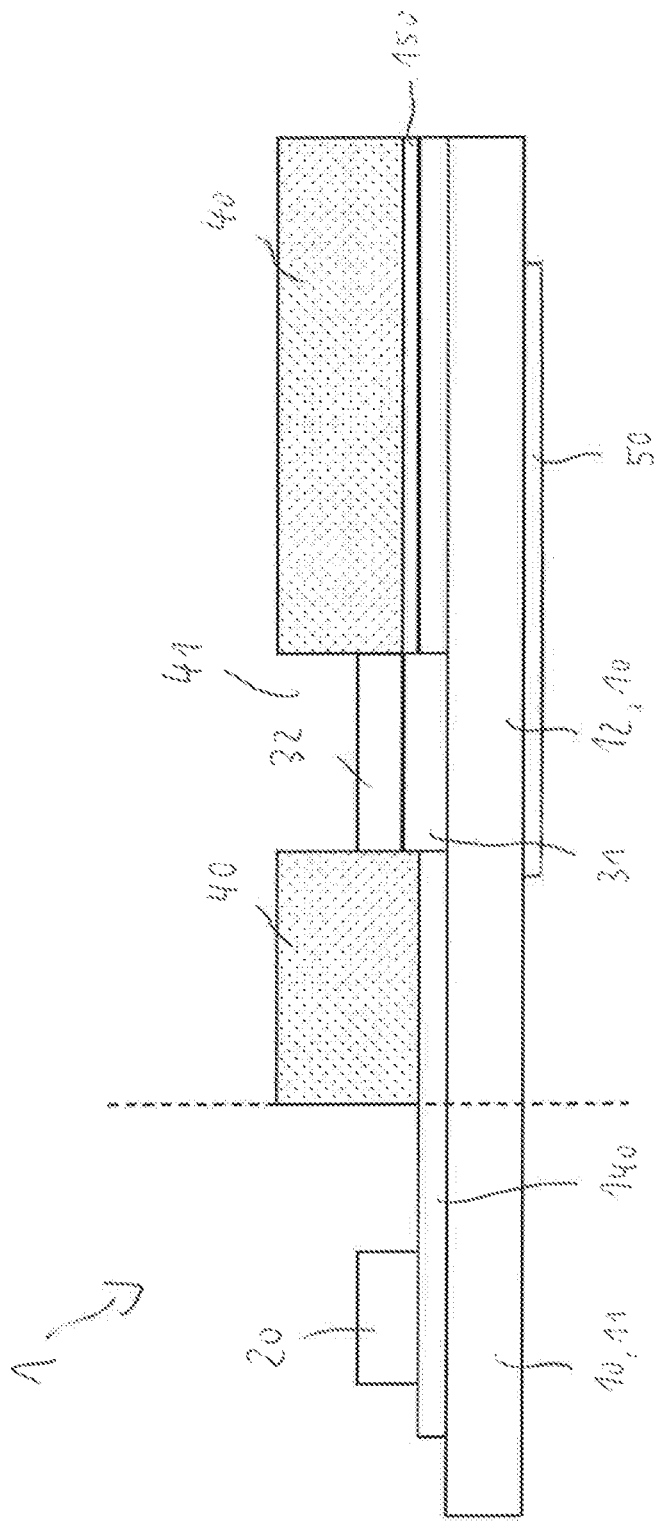

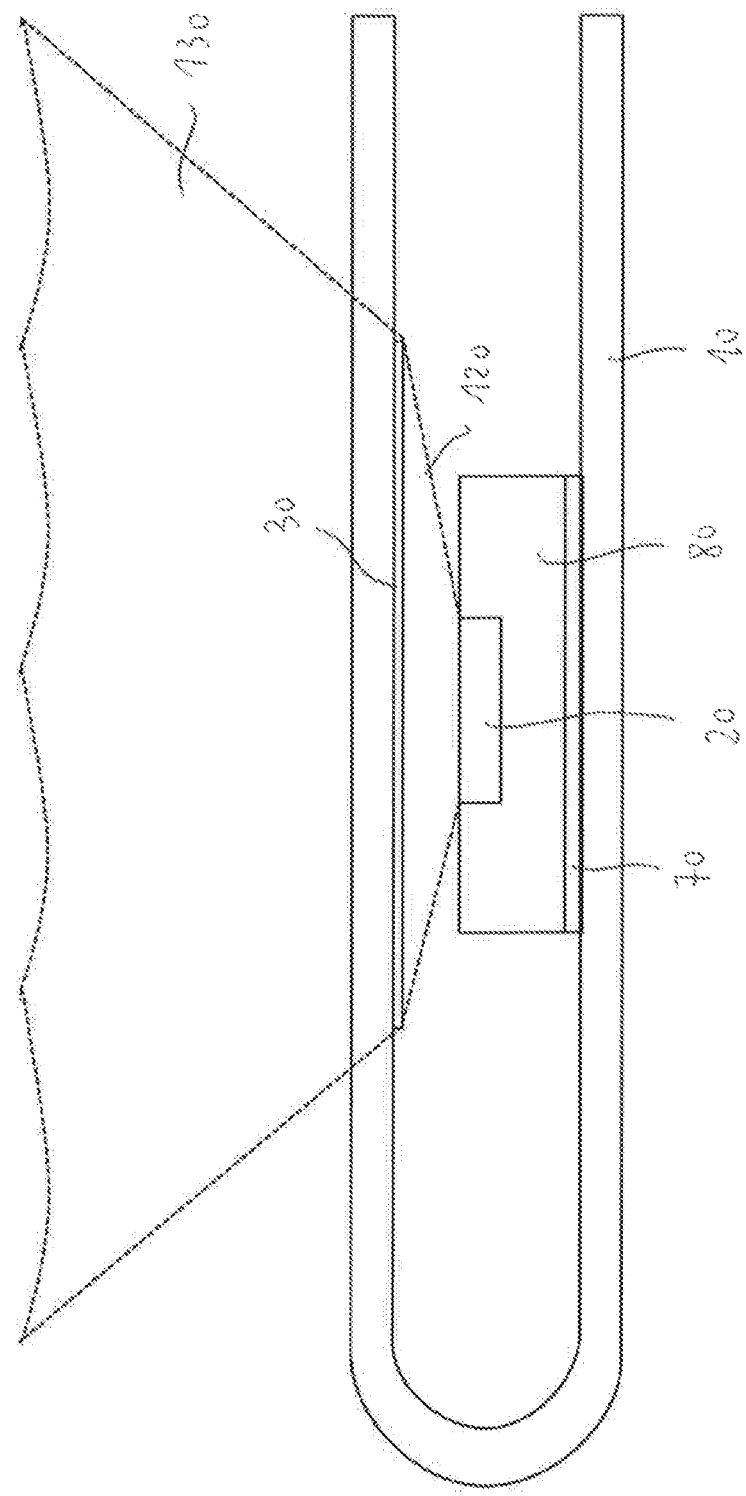

FOIL STRUCTURE WITH GENERATION OF VISIBLE LIGHT BY MEANS OF LED TECHNOLOGY

CROSS-REFERENCE TO RELATED APPLICATIONS

This application claims priority under 35 USC 119 of United States Patent Application Serial No. 10 2017 113 380.1 filed on Jun. 19, 2017, the disclosure of which is herein incorporated by reference.

BACKGROUND OF THE INVENTION

The invention relates to a foil structure with generation of visible light by means of an LED technology. Beyond this, the invention relates to a method for the manufacture of a foil structure with generation of visible light.

For illumination, LEDs are now used in many fields of application. For this purpose, the LEDs are usually soldered onto a printed circuit board. Especially for illumination of small areas or even for background illumination of an area or of symbols, such an arrangement of LEDs mounted on a printed circuit board needs a large installation space. The mounted structures often need many electronic parts, and so the construction is often complicated and the light outputs must be determined laboriously.

LEDs usually emit light in the UV or near-UV region. The conversion of the UV light into visible light takes place by a reaction layer, for example by a phosphor layer. This reaction layer is contained in a housing of the LED.

Because of their flexibility, electronic circuits—depending on application—are disposed on a flexible substrate, for example on a carrier foil. Instead of the mounting on a rigid printed circuit board, LEDs in principle may also be applied on a flexible foil as carrier material. The fabrication is generally laborious, however, since the housing of an LED cannot be applied with conventional insertion systems on a foil substrate.

SUMMARY OF THE INVENTION

It is therefore an object of the invention to provide a foil structure with generation of visible light by means of LED technology, wherein the foil structure has a small installation space and can be manufactured with relatively little fabrication effort. A further concern of the present invention is to specify a method for the manufacture of a foil structure with generation of light by means of LED technology, wherein the foil structure has a small installation space and the manufacturing method requires relatively little effort.

The invention therefore comprises a foil structure that comprises a carrier foil and an LED chip for generation of UV light. In the following, UV light means light in the wavelength region between 1 nm and 480 nm. The LED chip is disposed on a first portion of the carrier foil and is provided with a light output face for emission of the UV light. The foil structure comprises a color reaction layer for conversion of the UV light into the visible light, wherein the color reaction layer is disposed on a second portion of the carrier foil. The carrier foil is folded over in such a way that the second portion of the carrier foil is disposed above the first portion of the carrier foil and the color reaction layer 30 is disposed above the LED chip or in a manner laterally offset relative to the LED chip 20.

The present invention also relates to a method for the manufacture of a foil structure with generation of visible light by means of LED technology. The method is intended for the provision of a carrier foil and of an LED chip for generation of UV light with a light output face for emission of the UV light. The LED chip is disposed on a first portion of the carrier foil. A color reaction layer for conversion of the UV light into the visible light is disposed on a second portion of the carrier foil. The carrier foil is folded over in such a way that the second portion of the carrier foil is disposed above the first portion of the carrier foil in such a way that the color reaction layer is disposed above the LED chip or in a manner laterally offset relative to the LED chip.

According to a further embodiment of the method, the LED chip may be provided as an edge emitter, wherein the light output face of the LED chip is aligned perpendicular to the face of the second portion of the carrier foil, on which the color reaction layer is disposed. A spacing layer is disposed as a spacer on a third portion of the carrier foil between the first and second portions of the carrier foil. The carrier foil is folded over in such a way that the color reaction layer is disposed above the spacing layer after the folding over of the carrier foil.

Instead of the use of an LED chip, which together with a reaction layer is disposed for conversion of the invisible UV light into visible light in a plastic housing, the present foil structure uses only an LED chip which, disposed on a carrier foil, is integrated into the foil structure. The LED chip may be glued or bonded onto the carrier foil by means of an adhesive, for example an ACP adhesive.

From the light output face, the LED chip emits initially invisible light in the UV region. The reaction layer, which is necessary for generation of the visible light and converts the UV light emitted by the LED chip into visible light, may be printed either on the same carrier foil on which the LED chip is also disposed or on a separate carrier foil. The color reaction layer may contain phosphor for conversion of the UV light into visible light.

When the color reaction layer is disposed together with the LED chip on the same carrier foil, the carrier foil may be folded over in such a way that the color reaction layer is situated above the LED chip or above a light output region of the LED chip or in a manner laterally offset relative to the LED chip or laterally offset relative to the light output region of the LED chip. In the case of use of a separate foil on which the color reaction layer is disposed, the separate carrier foil may likewise be placed above the carrier foil containing the LED chip in such a way that the color reaction layer is disposed above the LED chip or above the light output region of the LED chip or in a manner laterally offset relative to the LED chip or in a manner offset laterally relative to the light output region of the LED chip.

An LED chip, meaning a chip that is in wafer form or on a wafer basis, that is separate from a wafer and that is not disposed in a housing, can be processed with conventional chip-inserting systems and, similarly to an RFID chip, for example, may be applied in mechanical and automated manner on the carrier foil. Likewise, for conversion of the UV light into visible light, the color reaction layer may be produced simply by printing on the carrier foil or on a separate carrier foil. Thus, the foil structure containing the LED chip may be fabricated by roll-to-roll rotary manufacturing.

BRIEF DESCRIPTION OF THE DRAWINGS

The invention will be explained in more detail in the following on the basis of figures, which show embodiments of the foil structure with generation of visible light, wherein:

FIG. 6 shows a further embodiment of a foil structure with generation of visible light by means of LED technology in a partial view with a UV-light-blocking layer;

FIG. 7 shows an embodiment of a foil structure with generation of visible light by means of LED technology in a partial view with a color reaction layer mixed into an adhesive layer;

FIG. 10A shows a further embodiment of a foil structure with generation of visible light by means of LED technology with a spacing layer in the form of a foam with recesses in a region between a light output face of an LED chip and a color reaction layer, before the folding;

FIG. 11 shows a further embodiment of a foil structure with generation of visible light by means of LED technology with an RFID chip with integrated LED.

DETAILED DESCRIPTION OF THE EMBODIMENTS

Figure 1:
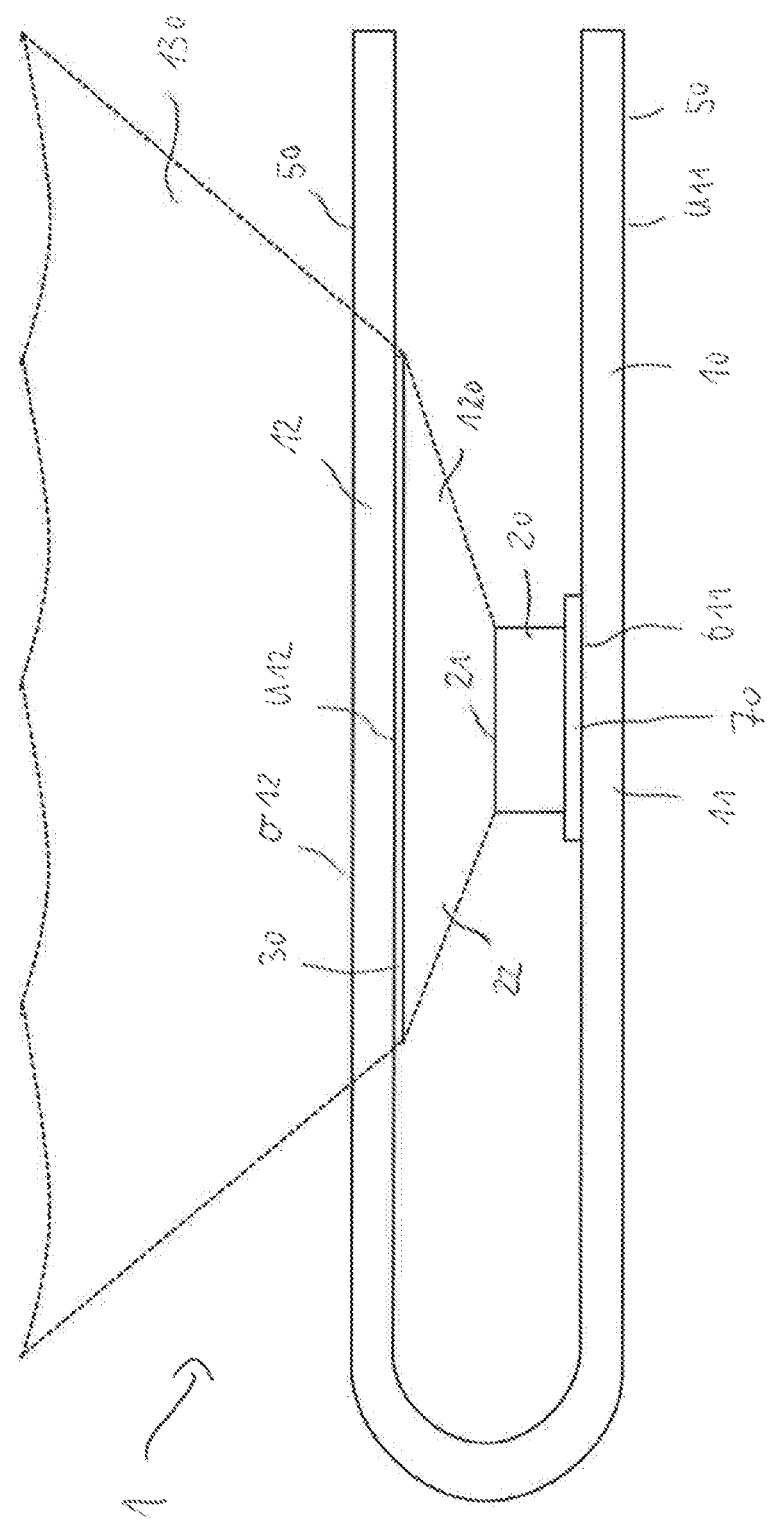
FIG. 1 shows an embodiment of a foil structure with generation of visible light by means of LED technology with a folded-over carrier foil.

FIG. 1 shows an embodiment of a foil structure 1 with a carrier foil 10, on which an LED chip 20 for generation of UV light is disposed. The LED chip 20 is provided with a light output face 21 for emission of UV light. The chip exists in wafer form. Thus, in contrast to a conventional LED, the chip is not contained in a plastic housing. Instead, the LED chip 20 comprises only the part of the silicon wafer with the light output face 21, from which the UV light is emitted, as well as a contact pad, which may be disposed on the upper side or underside of the LED chip.

For conversion of the UV light emitted by the LED chip 20 into visible light, the foil structure 1 is provided with a color reaction layer 30. The color reaction layer is disposed on the carrier foil 10. In the embodiment illustrated in FIG. 1, the carrier foil 10 is folded over in such a way that the color reaction layer 30 is disposed above the LED chip 20 or above a light output region 22 of the light output face 21 of the LED chip 20.

The LED chip 20 is disposed on a portion 11 of the carrier foil 10. The color reaction layer 30 is disposed on a portion 12 of the carrier foil 10. The LED chip 20 is disposed on an upper side O11 of the portion 11 of the carrier foil 10. The color reaction layer 30 is disposed on an underside U12 of the portion 12 of the carrier foil 10 that faces the upper side O11 of the portion 11 of the carrier foil 10. The embodiment of the foil structure 1 shown in FIG. 1 may also be modified such that the color reaction layer 30 is disposed on an upper side O12 of the portion 12 of the carrier foil 10 that faces away from the light output face 21 of the LED chip 20. The carrier foil 10 is folded over in such a way that the portion 12 of the carrier foil 10 is disposed above the portion 11 of the carrier foil 10.

In the embodiment of the foil structure 1 shown in FIG. 1, the light output face 21 of the LED chip 20 is disposed parallel to the face of the portion 12 of the carrier foil 10 on which the color reaction layer 30 is also disposed. The UV light 120, not visible to the human eye, emitted by the LED chip 20 from the light output face 21 is incident on the color reaction layer 30 and is converted by this into visible light 130. The visible light 130 passes through the portion 12 of the carrier foil 10 and is emitted into the surroundings. At least the portion 12 of the carrier foil 10 is designed to be translucent.

Figure 2:
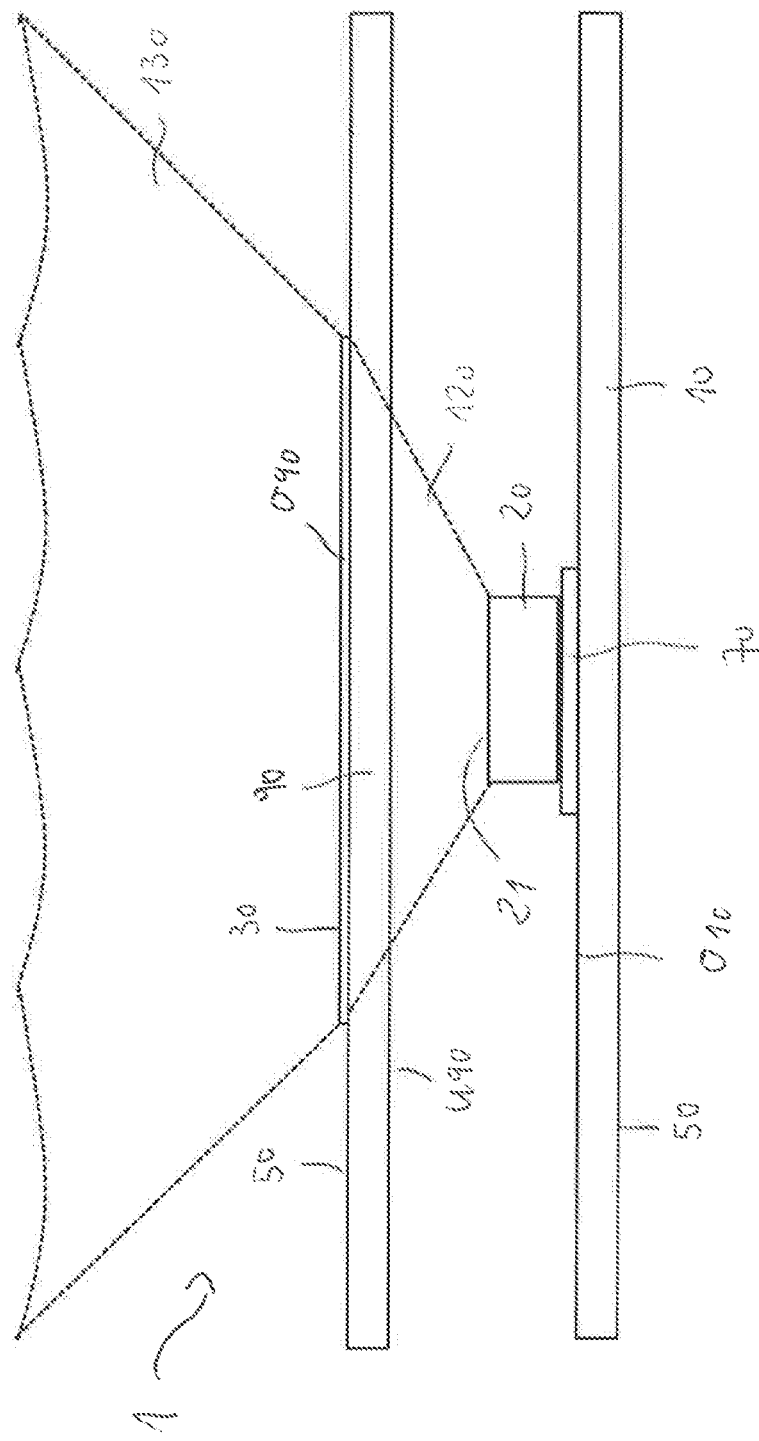
FIG. 2 shows a further embodiment of a foil structure with generation of visible light by means of LED technology with a separate carrier/cover foil for application of a color reaction layer.

FIG. 2 shows a further embodiment of a foil structure 1 for generation of visible light by means of an LED technology. The foil structure comprises the carrier foil 10 as well as the LED chip 20 for generation of UV light with a light output face 21 for emission of the UV light 120. The LED chip 20 is disposed on an upper side O10 of the carrier foil 10 and emits UV light 120 upward from the light output face 21. The color reaction layer 30 is provided for conversion of the UV light 120 into the visible light 130.

In contrast to the embodiment shown in FIG. 1, the color reaction layer 30 is disposed on a separate carrier or cover foil 90. As in the embodiment shown in FIG. 1, the color reaction layer 30 may be disposed on an underside U90 of the separate carrier foil 90. FIG. 2 shows an embodiment in which the color reaction layer 30 is disposed on an upper side O90 of the separate carrier foil 90. The upper side O90 of the carrier foil 90 is that surface of the carrier foil 90 that faces away from the light output face 21 of the LED chip 20.

Figure 3:
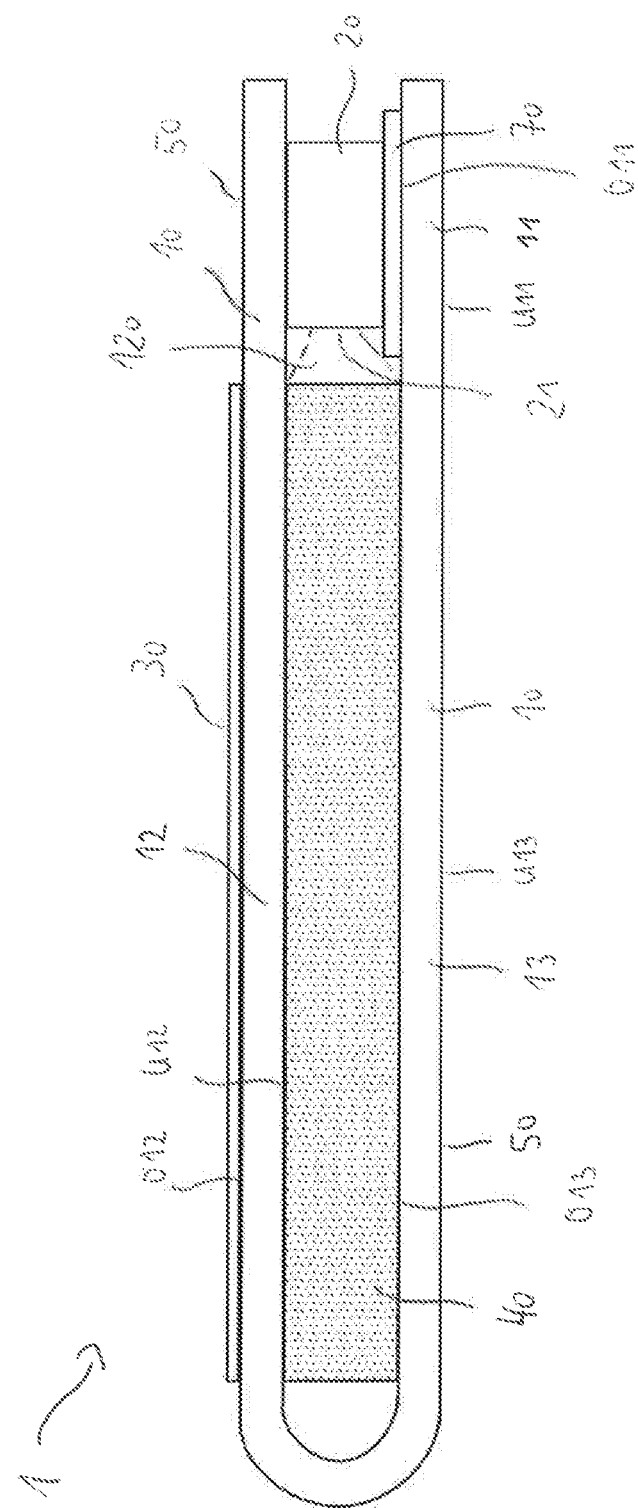
FIG. 3 shows a further embodiment of a foil structure with generation of visible light by means of LED technology with a folded-over carrier foil and an LED chip as edge emitter.

FIG. 3 shows a further embodiment of the foil structure 1 with a carrier foil 10, on which an LED chip 20 for generation of UV light is disposed. The LED chip 20 is disposed on the upper side O11 of the portion 11 of the carrier foil 10. The LED chip 20 is provided with the light output face 21 for emission of the UV light. Furthermore, the foil structure 1 comprises the color reaction layer 30 for conversion of the UV light into the visible light. In the embodiment illustrated in FIG. 3, the color reaction layer 30 is disposed on the portion 12 of the carrier foil 10 that faces away from the upper side O11 of the portion 11 of the carrier foil 10. As illustrated in FIG. 3, the color reaction layer 30 may be disposed on the upper side O12 of the portion 12 of the carrier foil 10 and also on the underside U12 of the portion 12 of the carrier foil 10 that faces the upper side O11 of the portion 11 of the carrier foil 10.

In contrast to the embodiment shown in FIG. 1, the carrier foil 10 is folded over in such a way that the color reaction layer 30 is disposed in a manner laterally offset relative to the LED chip 20 or laterally offset relative to the light output region 22 of the light output face 21 of the LED chip 20. The carrier foil 10 is folded over in such a way that the portion 12 of the carrier foil 10 is disposed in a manner laterally offset relative to the portion 11 of the carrier foil. The LED chip 20 is formed as an edge emitter. The light output face 21 of this LED chip 20 is disposed perpendicular to the face of the portion 12 of the carrier foil 10 on which the color reaction layer 30 is also provided.

A portion 13 of the carrier foil is disposed between the portion 11 and the portion 12 of the carrier foil. The foil structure according to FIG. 3 comprises a spacing layer 40. The spacing layer 40 is disposed between the portion 12 and the portion 13 of the carrier foil 10. In the embodiment of the foil structure 1 shown in FIG. 3, the LED chip 20 is formed as an edge emitter and emits UV light 120 laterally from the light output face 21 into the spacing layer 40. The spacing layer 40 may be formed as a light-guide foil, in which the light is deflected or scattered in the direction of the color reaction layer 30. The UV light is converted into visible light in the color reaction layer 30 and emitted into the surroundings.

Figure 4:
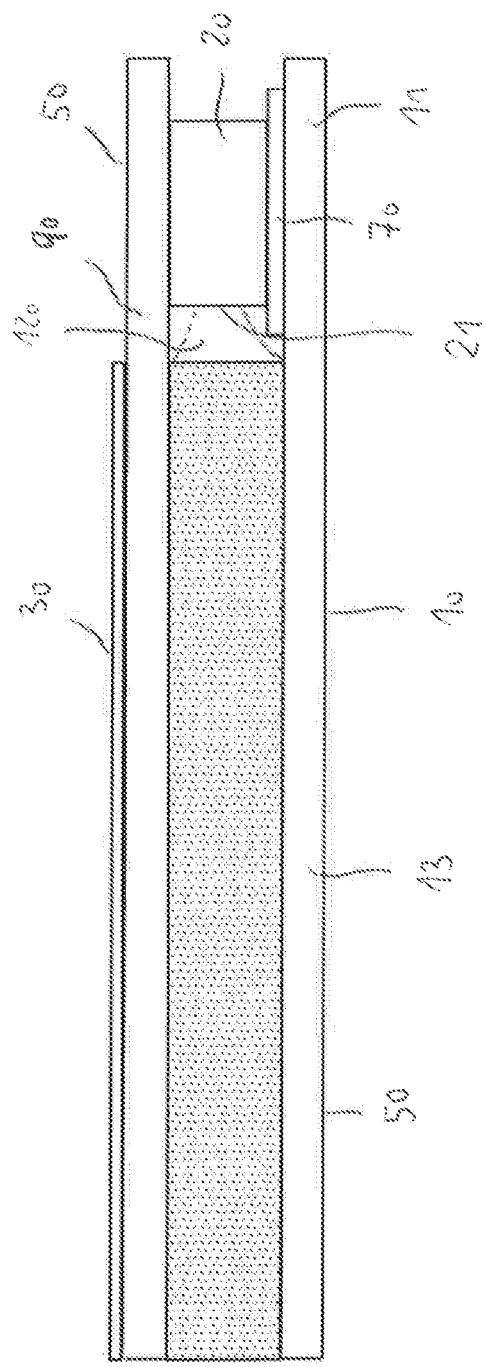
FIG. 4 shows a further embodiment of a foil structure with generation of visible light by means of LED technology with separate carrier/cover foil and an LED chip as edge emitter.

FIG. 4 shows an embodiment of the foil structure 1 with a carrier foil 10, on which an LED chip 20 is disposed. A separate carrier or cover layer 90 is disposed above the LED chip 20. The foil structure is provided with the color reaction layer 30 for conversion of the UV light emitted from the light output face 21 of the LED chip into visible light. The color reaction layer 30 is disposed on the separate carrier/cover foil 90. The color reaction layer 30 may be disposed on an underside U90 or an upper side O90 of the carrier/cover foil 90.

In particular, the color reaction layer 30 is disposed in a manner laterally offset relative to the LED chip 20 or laterally offset relative to the light output face 21 of the LED chip 20. The spacing layer 40 is provided between the portion of the carrier/cover foil 90 that is disposed in a manner laterally offset relative to the LED chip 20 and the portion of the carrier foil 10 that is disposed in a manner laterally offset relative to the LED chip 20. As in the embodiment shown in FIG. 3, the LED chip 20 is formed as an edge emitter. The light output face 21 of the LED chip 20 is disposed parallel to the normal to the carrier/cover foil 90 or parallel to the normal to the carrier foil 10. The LED chip 20 emits the UV light laterally from the light output face 21 into the spacing layer 40. As in the embodiment shown in FIG. 3, the spacing layer 40 may be formed as a light-guide foil, which deflects or scatters the UV light in the direction of the color reaction layer 30.

It must be pointed out that the color reaction layer 30 in the embodiments of the foil structure shown in FIGS. 3 and 4 may be disposed, instead of on the portion 12 of the carrier foil 10 or on the carrier/cover foil 90, also on an upper side or underside of the region 13 of the carrier foil 10. In this case, the spacing layer 40 is formed in such a way that it deflects or scatters the incident UV light in the direction of the portion 13 of the carrier foil 10.

The LED chip 20 may be operated with direct and low-voltage current. Thereby it is not necessary to use any complex voltage conversion or energy source. In the embodiment of the foil structure 1 shown in FIGS. 1 to 4, an electrical conductor track may be applied on the carrier foil 10 for the supply of a voltage to the LED chip 20. All suitable printing methods, for example, screen, flexographic, intaglio, inkjet or pad printing, may be used for this purpose.

The LED chip 20 is preferably formed with a contact pad on the side situated opposite the light output face 21. By means of a transparent anisotropic conductive adhesive, it is also possible to use a conventional LED chip with contacts on the luminous side. In this embodiment, the LED chip 20 may be glued onto the carrier foil by means of the transparent, anisotropic conductive adhesive. In the embodiments of the foil structure illustrated in FIGS. 1 to 4, an adhesive 70, which in particular may be formed as an anisotropic conductive adhesive, is applied on the back side of the LED chip 20, in order to glue the LED chip 20 onto the carrier foil 10.

The following FIGS. 5A to 7 show a partial view of the foil structure 1. What is illustrated is only a partial view of the folded foil structure 1 of FIGS. 1 and 3, in which the color reaction layer 30 is disposed on the upper side O12 of the portion 12 of the carrier foil 10. However, the embodiments of the foil structure shown in FIGS. 5A to 7 are also applicable to the embodiments of the foil structure containing the separate carrier/cover foil 90 shown in FIGS. 2 and 4. In these cases, the color reaction layer 30 shown in FIGS. 5A to 7 is disposed on the carrier/cover foil 90. Although FIGS. 5A to 7 show the color reaction layer 30 on the upper side O12 of the portion 12 of the carrier foil 10, the color reaction layer in the described embodiments of the foil structure may also be disposed on the underside U12 of the portion 12 of the carrier foil 10 or on the underside U90 of the carrier/cover foil 90. Likewise, the color reaction layer 30 for the embodiments of FIGS. 5A to 7 described in the following may also be disposed on the upper side or underside of the portion 13 of the carrier foil 10.

Figure 5A:
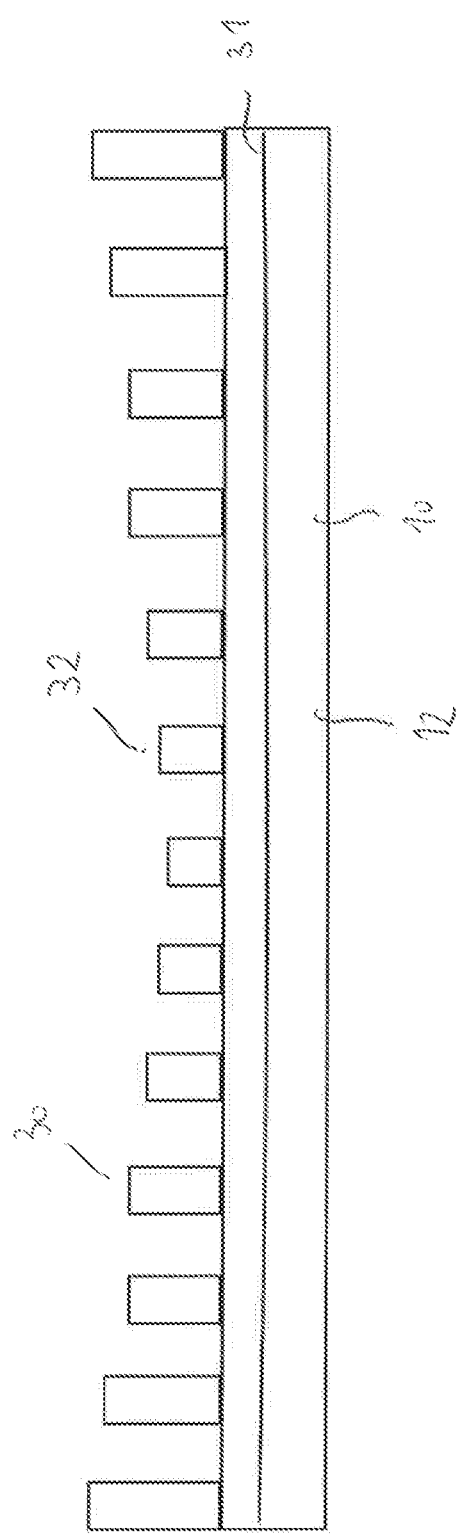
FIG. 5A shows an embodiment of a foil structure with generation of visible light by means of LED technology in a partial view with a color reaction layer applied on a carrier foil in the form of an amplitude-modulated grid.
Figure 5B:
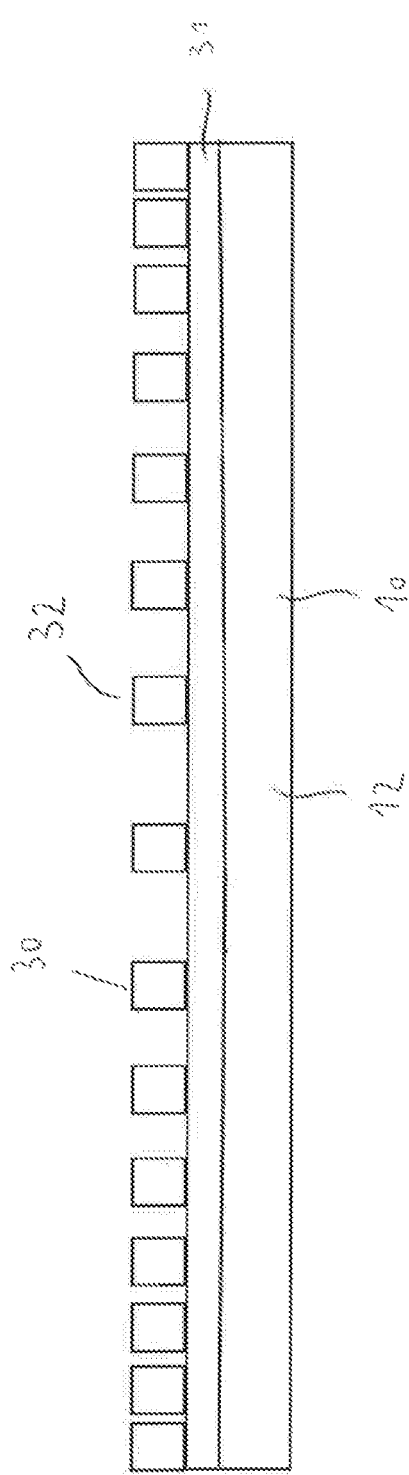
FIG. 5B shows an embodiment of a foil structure with generation of visible light by means of LED technology in a partial view with a color reaction layer applied on a carrier foil in the form of a frequency-modulated grid.

The color reaction layer 30 may be applied in full-surface manner on the carrier foil 10, as illustrated in FIGS. 1 to 4. FIGS. 5A and 5B show an embodiment of the foil structure 1 in which the color reaction layer 30 is disposed in partial-surface manner on the upper side O12 of the portion 12 of the carrier foil 10. In this case, the color reaction layer 30 is disposed in the form of a dot or line grid on the carrier foil 10. The color reaction layer 30 may be applied in particular as an amplitude-modulated and/or frequency-modulated grid of dots or lines on the carrier foil 10. Various additive application methods may be used.

In the embodiments of the foil structure 1 shown in FIGS. 5A and 5B, the color reaction layer 30 is applied as a layer sequence of two different courses 31 and 32 on the carrier foil 10. The lowest course 31 of the color reaction layer 30 is disposed in full-surface manner on the upper side O12 of the portion 12 of the carrier foil 10. A further course 32 of the color reaction layer 30 is applied in the form of a grid above the course 31.

In the embodiment shown in FIG. 5A, the grid is amplitude-modulated, by the fact that the height of the grid dots/grid lines, starting from a position at the center above the light output face 21 of the LED chip, increases toward both rims of the color reaction layer 30. In the embodiment shown in FIG. 5B, the grid is frequency-modulated, by the fact that the grid dots/grid lines of the course 32 of the color reaction layer 30 have, at the center above the light output face 21 of the LED chip 20, a large spacing, which decreases toward both rims of the color reaction layer 30.

Such an amplitude-modulated or frequency-modulated grid of the color reaction layer 30 may be used for homogenization of the light emitted by the LED chip 20. The course 31 of the color reaction layer 30 applied in full-surface manner may be designed, for example, to absorb the UV light emitted by the LED chip 20, so that no UV light is emitted into the surroundings.

Furthermore, due to the courses 31 and 32 disposed one above the other, mixed colors of the visible light may be generated. The course 31 of the color reaction layer 30 applied in full-surface manner may be provided, for example, with a phosphor having an emission wavelength of 515 nm. For example, the course 31 converts incident blue light into green light. The course 32 of the color reaction layer 30 may be provided with phosphor having an emission wavelength of 630 nm and convert the green light emerging from the course 31 into red light. An observer therefore sees the light emerging from the courses 31 and 32 of the color reaction layer 30 as a mixed color, for example as yellow light.

The phosphors are available in a graduation of 5 nm and accordingly are able to generate almost any arbitrary color. By skillful printing one upon the other, therefore, it is possible to generate many different colors with only a few basic colors, and complexity of production can be reduced.

A further possibility for homogenization of the light emitted by the LED chip 20 is the use, in the color reaction layer 30, of "self-luminous" phosphor particles, which are applied, for example, printed, on the carrier foil 10. In order to influence the resultant luminous color emitted by the color reaction layer 30 after irradiation with UV light, it is possible to mix daylight pigments into the color reaction layer 30. The mixing may also be carried out by printed layers or in liquid form.

FIG. 6 shows an embodiment of the foil structure 1 in which, relative to an observer, a UV-light-blocking layer 100 has been applied above the color reaction layer 30. Above the UV-light-blocking layer 100, it is optionally possible to apply a colored layer 110, for example a white-colored layer. The effect between a switched-on and switched-off state of the LED chip may be intensified by the use of such a layer sequence between the color reaction layer 30 and the ambient light.

For example, in the switched-off state of the LED chip, the UV-light-blocking layer 100 prevents a symbol, which is impressed by suitable structuring in the color reaction layer 30, from being visible to an observer. Instead, in the switched-off state of the LED chip 20, the observer sees only the white-colored layer 110. It is only in the switched-on state of the LED chip 20 that the pattern impressed in the color reaction layer 30 becomes visible to an observer on the basis of the backlighting of the color reaction layer 30 due to the light emitted by the LED chip.

For gluing of the carrier foil 10 onto a substrate, the carrier foil 10 may be formed in self-adhesive or partly adhesive manner. For this purpose, an adhesive layer 50 may be applied, as shown in FIGS. 1 and 3, on the upper side O12 of the portion 12 of the carrier foil 10 and/or on the underside U11 of the portion 11 and/or on the underside U13 of the portion 13 of the carrier foil 10. In the case of the mounted foil structure of FIGS. 2 and 4, the adhesive layer 50 may be disposed on the upper side O90 of the carrier/cover foil 90 and/or on the underside U11 of the portion 11 and/or on the underside U13 of the portion 13 of the carrier foil 10.

FIG. 7 shows the foil structure 1 with the adhesive layer 50, which for application of the foil structure 1 on a substrate is disposed on an upper side O12 of the portion 12 of the carrier foil 10. For backlighting of an object, for example, the foil structure 1 can be glued by means of the adhesive layer 50 on the back side of the object. FIG. 7 shows an embodiment of the foil structure 1 in which the color reaction layer 30 is integrated in the adhesive layer 50 by the fact that particles 33 of the color reaction layer 30, which convert the UV light into visible light, are mixed in with the adhesive layer 50. In the case of gluing of the foil composite onto a transparent/semitransparent pane, a luminous area may therefore be generated when the LED chip 20 is switched on.

According to another embodiment, the particles 33 of the color reaction layer 30, especially the phosphor particles, may be applied via a contactless method, for example by an inkjet printing method or by dispensing on the adhesive layer 50. Under certain circumstances, therefore, there is no need for a foil layer.

Figure 8:
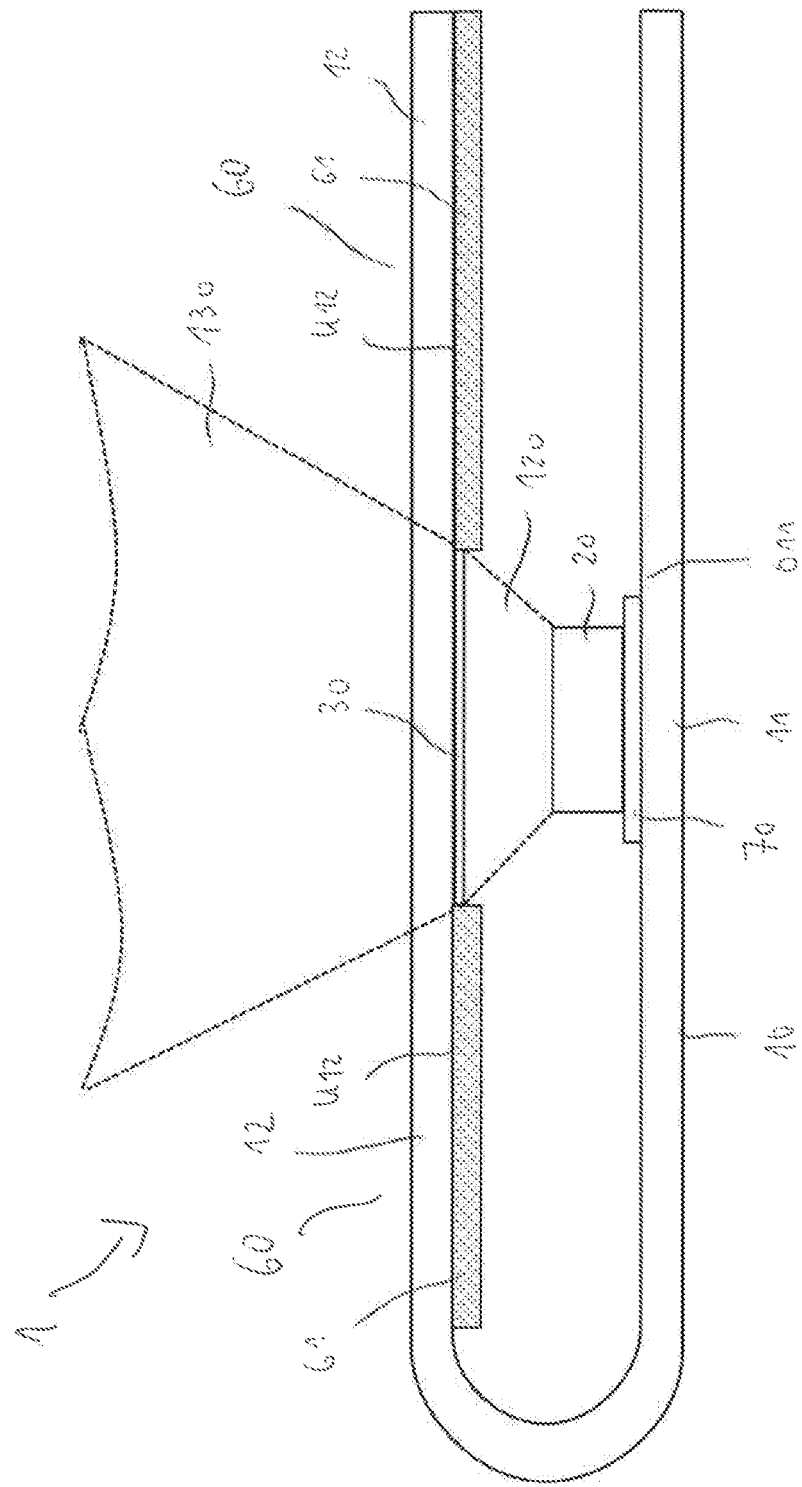
FIG. 8 shows a further embodiment of a foil structure with generation of visible light by means of LED technology with a touch-sensitive sensor.
Figure 9:
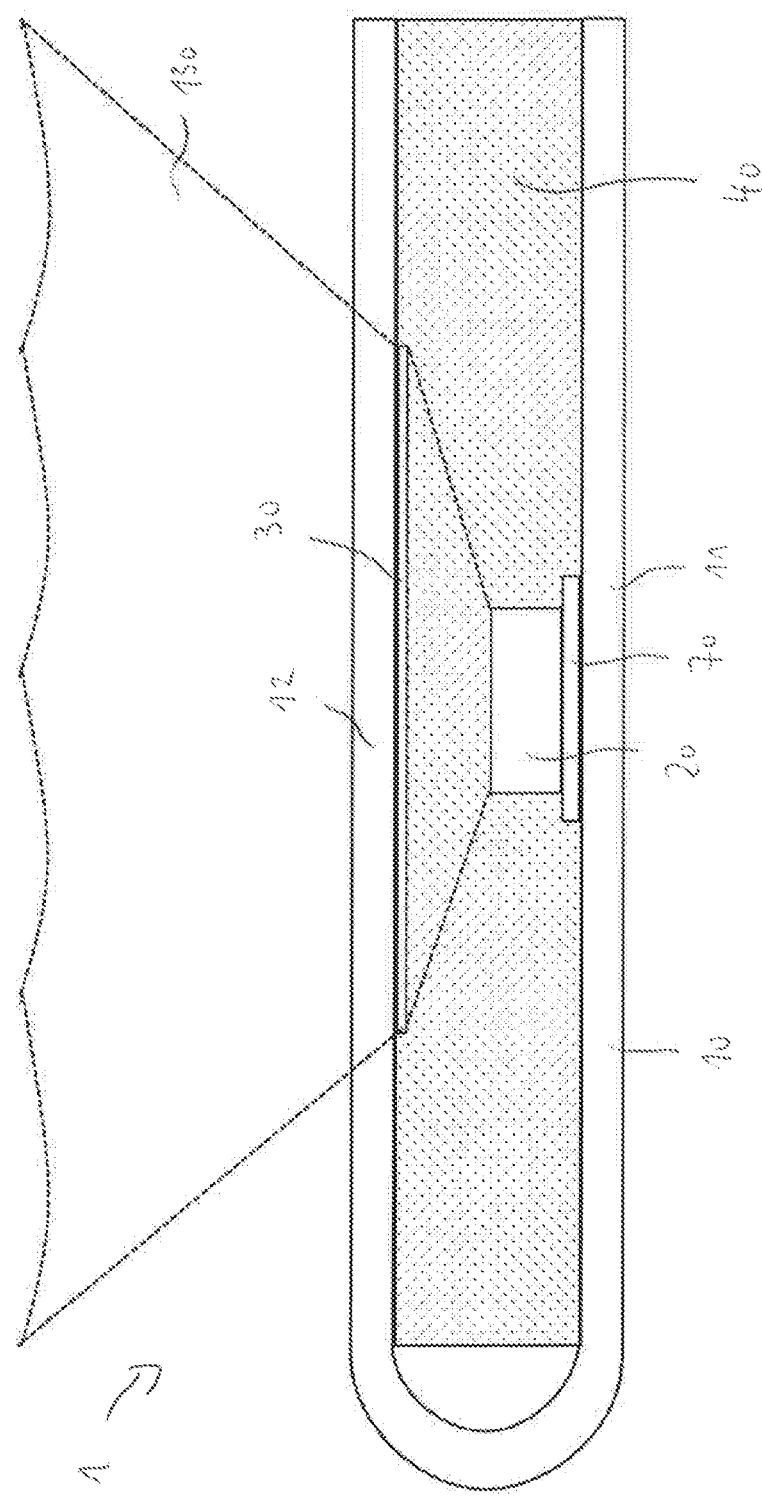
FIG. 9 shows a further embodiment of a foil structure with generation of visible light by means of LED technology with a spacing layer between a light output face of an LED chip and a color reaction layer.

FIGS. 8 to 10 show further embodiments of the foil structure 1 for the example of mounted foil structures with a folded-over carrier foil 10, such as is illustrated in FIGS. 1 and 3. The embodiments of the foil structure illustrated in FIGS. 8 to 10 are likewise applicable in the case of mounted foil structures with separate carrier/foil 90, such as are illustrated in FIGS. 2 and 4.

FIG. 8 shows a foil structure 1, which comprises a touch-sensitive sensor 60. The touch-sensitive sensor 60 comprises a conductive structure 61, for example a conductor track, which is disposed on the underside U12 of the portion 12 of the carrier foil 10. Thereby it is possible to print a capacitive switch on the portion 12 of the carrier foil 10. The printed conductive structure 61 forms a capacitor plate of the capacitive sensor. It may be connected to an evaluation electronic unit, not illustrated in FIG. 8, or to the activation electronic unit for control of the LED chip.

Especially for mounted foil structures with folded-over carrier foil, the conductive structure 61 may be printed in one plane prior to the folding, and after the folding is present in two planes. Thus it is possible to print a capacitive switch on what will later be the cover layer of the LED chip, in which case the LED chip is disposed at a spacing underneath the capacitive switch.

The light yield of the light emerging from the luminous area of the color reaction layer 30 may be influenced via the layer sequence and the spacings between the light output face 21 and the color reaction layer 30. FIG. 9 shows an embodiment of the foil structure 1, in which a spacing layer 40 is disposed between the light output face 21 of the LED chip 20 and the color reaction layer 30, in order to influence the spacing between the light output face 21 and the color reaction layer 30. As shown in FIGS. 3 and 4, the spacing layer 40 may also be disposed between the portion 13 of the carrier foil 10 and the portion 12 of the carrier foil 10 or between the portion 13 of the carrier foil 10 and the carrier/cover foil 90.

The spacing layer 40 may be formed as a transparent foil in appropriate thickness. Furthermore, a transparent foil containing prisms for light distribution may be used as the spacing layer 40. Furthermore, a matted (milky) foil may be used as the spacing layer 40. Furthermore, the possibility exists of disposing, as the spacing layer 40, printed clear and colored lacquers (similarly to braille) in partial-surface or full-surface manner between the light output face 21 of the LED chip 20 and the color reaction layer 30. Furthermore, printed droplets, which have a lens effect, may be applied as spacing layer 40 between the light output face 21 of the LED chip 20 and the color reaction layer 30.

FIG. 10A shows an embodiment of the foil structure 1 prior to the folding of the carrier foil 10. The carrier foil 10 is folded over along the fold line shown in the manner of a dashed line. For the supply of a voltage to the LED chip 20, a conductor track 140 is glued onto the carrier foil 10. To the left of the fold line, the LED chip 20 is disposed together with the conductor track 140 supplying a voltage. To the right of the fold line, a two-layer structure of the color reaction layer 30 comprising a course 31 and a course 32 is applied above the conductor track 140. A portion of the conductor track 140 is covered with a protective layer 150. The back side of the carrier foil 10 is equipped with a layer of a transfer adhesive 50, in order to glue the foil structure onto a substrate.

Figure 10B:
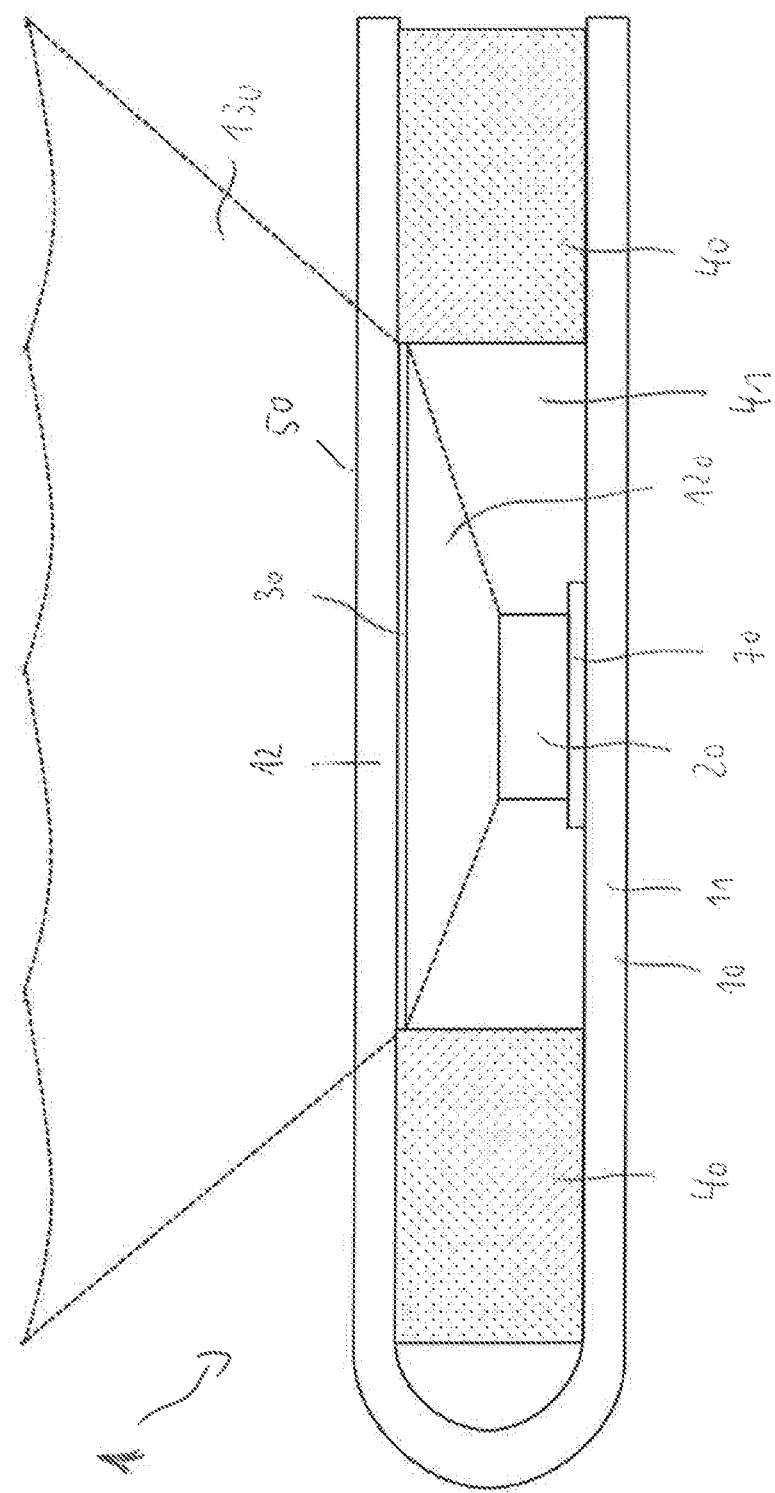
FIG. 10B shows a further embodiment of a foil structure with generation of visible light by means of LED technology with a spacing layer in the form of a foam with recesses in a region between a light output face of an LED chip and a color reaction layer, after the folding.

To establish a defined spacing between the courses 31 and 32 of the color reaction layer 30, the spacing layer 40 is provided in the form of a foam. Above the color reaction layer 30, the spacing layer 40 has a recessed region 41, so that light from the light output face 21 of the LED chip 20 can be incident on the color reaction layer 30. FIG. 10B shows the foil structure of FIG. 10A after the folding. For simpler illustration, the conductor track 140 with the protective layer 150 is not illustrated.

According to another embodiment, the spacing layer 40 comprising the foam may also be applied in full-surface manner above the color reaction layer 30, if a translucent foam or a foam structure is used for light distribution.

FIG. 11 shows an embodiment of the foil structure 1 with an RFID chip 80, which is disposed on the carrier foil 10. The LED chip 20 may be integrated in the RFID chip 80 and formed for the purpose of indicating an operating state of the RFID chip 80. The LED chip 20 may be digitally controlled. In this way it is possible, for example, to recognize optically whether the RFID chip 80 is being read. The energy of the RFID field is sufficient for operation of the LED chip 20.

The overall structure of the foil composite 1 may be processed by analogy with RFID inlays. The foil composite 1 may be finished, for example with adhesives and further laminates. Beyond this, the foil structure 1 may be sprayed, cast or foam-embedded, in order to be integrated into a final product.

LIST OF REFERENCE SYMBOLS

1 Foil structure
10 Carrier foil
20 LED chip
30 Color reaction layer
40 Spacing layer
50 Adhesive layer
60 Touch-sensitive sensor
70 Adhesive
80 RFID chip
90 Carrier/cover foil
100 UV-light-blocking layer
110 Color layer
120 UV light
130 Visible light
140 Conductor track
150 Protective layer

What is claimed is:

1. A foil structure with generation of visible light by LED technology, comprising:
   a carrier foil,
   an LED chip configured for generating UV light and being disposed on a first portion of the carrier foil and being provided with a light output face for emission of the UV light,
   a color reaction layer configured for converting the UV light into visible light, the color reaction layer being disposed on a second portion of the carrier foil, and
   a spacing layer being disposed between the first portion and the second portion of the carrier foil,
   wherein the carrier foil is folded over in such a way that the second portion of the carrier foil is disposed above the first portion of the carrier foil and the color reaction layer is disposed above the LED chip or in a manner laterally offset relative to the LED chip, and
   wherein the spacing layer has a recessed region between the light output face of the LED chip and the color reaction layer so that light from the light output face of the LED chip is incident on the color reaction layer.

2. The foil structure according to claim 1, wherein the light output face of the LED chip is disposed parallel to a face of the second portion of the carrier foil on which the color reaction layer is disposed.

3. The foil structure according to claim 2, wherein the LED chip is disposed on an upper side of the first portion of the carrier foil, and wherein the color reaction layer is disposed on an underside of the second portion of the carrier foil that faces the upper side of the first portion of the carrier foil.

4. The foil structure according to claim 2, wherein the LED chip is disposed on an upper side of the first portion of the carrier foil, and wherein the color reaction layer is disposed on an upper side of the second portion of the carrier foil that faces away from the upper side of the first portion of the carrier foil.

5. The foil structure according to claim 2, further comprising an adhesive layer configured for application of the foil structure on a substrate, wherein the adhesive layer is disposed on an upper side of the second portion of the carrier foil that faces away from the underside of the first portion of the carrier foil.

6. The foil structure according to claim 5, wherein the color reaction layer is provided with particles, which convert the UV light into the visible light, and wherein the particles are mixed in with the adhesive layer.

7. The foil structure according to claim 2, further comprising a touch-sensitive sensor, wherein the LED chip is disposed on an upper side of the first portion of the carrier foil, and wherein the touch-sensitive sensor comprises a conductive structure, which is disposed on an underside of the second portion of the carrier foil that faces the upper side of the first portion of the carrier foil.

8. The foil structure according to claim 1, wherein the LED chip is glued onto the carrier foil by a transparent, anisotropic conductive adhesive.

9. The foil structure according to claim 1, wherein the spacing layer is formed from a material selected from the group consisting of a transparent foil, a transparent foil containing prisms for light distribution, a matted foil, a clear, colorless lacquer, a colored lacquer and a foam.

10. The foil structure according to claim 1, further comprising an RFID chip disposed on the carrier foil, wherein the LED chip is integrated in the RFID chip and indicates an operating state of the RFID chip.

11. A foil structure with generation of visible light by LED technology, comprising:
    a carrier foil,
    a further carrier foil,
    an LED chip configured for generating UV light and being disposed on the carrier foil and being provided with a light output face for emission of the UV light,
    a color reaction layer configured for converting the UV light into visible light, the color reaction layer being disposed on the further carrier foil above the LED chip, and
    a spacing layer,
    wherein the further carrier foil is disposed above the carrier foil with the LED chip, and
    wherein the spacing layer is disposed between the carrier foil and the further carrier foil, and the spacing layer has a recessed region between the light output face of the LED chip and the color reaction layer so that light from the light output face of the LED chip is incident on the color reaction layer.

12. The foil structure according to claim 11, wherein the light output face of the LED chip is disposed parallel to a face of the further carrier foil on which the color reaction layer is disposed.

13. The foil structure according to claim 12, wherein the LED chip is disposed on an upper side of the carrier foil, and wherein the color reaction layer is disposed on an underside of the further carrier foil that faces the upper side of the carrier foil, or on an upper side of the further carrier foil that faces away from the upper side of the carrier foil.

14. The foil structure according to claim 12, further comprising an adhesive layer configured for application of the foil structure on a substrate, wherein the adhesive layer is disposed on an upper side of the further carrier foil that faces away from the underside of the carrier foil.

15. The foil structure according to claim 14, wherein the color reaction layer is provided with particles, which convert the UV light into the visible light, and wherein the particles are mixed in with the adhesive layer.

16. The foil structure according to claim 12, further comprising a touch-sensitive sensor, wherein the LED chip is disposed on an upper side of the carrier foil, and wherein the touch-sensitive sensor comprises a conductive structure, which is disposed on an underside of the further carrier foil that faces the upper side of the carrier foil.

17. The foil structure according to claim 11, wherein the LED chip is glued onto the carrier foil by a transparent, anisotropic conductive adhesive.

18. The foil structure according to claim 11, wherein the spacing layer is formed from a material selected from the group consisting of a transparent foil, a transparent foil containing prisms for light distribution, a matted foil, a clear, colorless lacquer, a colored lacquer and a foam.

19. The foil structure according to claim 11, further comprising an RFID chip disposed on the carrier foil, wherein the LED chip is integrated in the RFID chip and indicates an operating state of the RFID chip.

20. A method for the manufacture of a foil structure with generation of visible light, comprising:
providing, according to a first alternative of the method, a carrier foil and an LED chip for generation of UV light with a light output face for emission of the UV light, or, according to a second alternative of the method, providing a carrier foil, a further carrier foil and an LED chip for generation of UV light with a light output face for emission of the UV light,
disposing the LED chip on a first portion of the carrier foil,
disposing, according to the first alternative of the method, a color reaction layer configured for conversion of the UV light into the visible light on a second portion of the carrier foil, or disposing, according to the second alternative of the method, a color reaction layer configured for conversion of the UV light into the visible light on the further carrier foil,
folding, according to the first alternative of the method, over the carrier foil so that the second portion of the carrier foil is disposed above the first portion of the carrier foil so that the color reaction layer is disposed above the LED chip or in a manner laterally offset relative to the LED chip, and disposing a spacing layer between the first and second portion of the carrier foil so that, after folding over the carrier foil, a recessed region of the spacing layer is disposed between the light output face of the LED chip and the color reaction layer, and light from the light output face of the LED chip is incident on the color reaction layer, or
disposing, according to the second alternative of the method, the further carrier foil above the carrier foil with the LED chip, and disposing a spacing layer between the carrier foil and the further carrier foil so that, after disposing the further carrier foil above the carrier foil, a recessed region of the spacing layer is disposed between the light output face of the LED chip, and light from the light output face of the LED chip is incident on the color reaction layer.

* * * * *